(12) United States Patent
Jonke

(10) Patent No.: US 11,355,913 B2
(45) Date of Patent: Jun. 7, 2022

(54) PROTECTING ANALOG OUTPUT CIRCUITS FROM SHORT CIRCUITS

(71) Applicant: Hamilton Sundstrand Corporation, Charlotte, NC (US)

(72) Inventor: Christopher J. Jonke, Unionville, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 298 days.

(21) Appl. No.: 16/597,904

(22) Filed: Oct. 10, 2019

(65) Prior Publication Data
US 2021/0111551 A1    Apr. 15, 2021

(51) Int. Cl.
*H02H 3/08*    (2006.01)
*H02H 1/00*    (2006.01)

(52) U.S. Cl.
CPC .......... *H02H 3/08* (2013.01); *H02H 1/0007* (2013.01); *H02H 1/0092* (2013.01)

(58) Field of Classification Search
CPC ...... H02H 3/08; H02H 1/0007; H02H 1/0092; H03K 19/018592
USPC ......................................................... 361/87
See application file for complete search history.

(56) References Cited

U.S. PATENT DOCUMENTS

| 7,545,126 | B2 | 6/2009 | Su et al. |
| 7,619,865 | B2* | 11/2009 | Thiery ............... H03K 17/0822 |
| | | | 361/93.1 |
| 9,178,462 | B2 | 11/2015 | Kurosawa et al. |
| 10,291,119 | B2 | 5/2019 | Yaguchi |
| 2013/0335099 | A1 | 12/2013 | Di Sarro et al. |
| 2019/0074827 | A1 | 3/2019 | Norling et al. |

FOREIGN PATENT DOCUMENTS

| EP | 3644513 A1 | 4/2020 |
| JP | H09181606 A * | 7/1997 |

OTHER PUBLICATIONS

Machine Translation of Boku Japanese Patent Document JP H09181606 A Jul. 11, 1997 (Year: 1997).*
European Search Report; European Application No. 19215535.6; Application Filed: Dec. 12, 2019; Report dated Jul. 2, 2020; 8 pages.

* cited by examiner

*Primary Examiner* — Kevin J Comber
(74) *Attorney, Agent, or Firm* — Cantor Colburn LLP

(57) ABSTRACT

Systems, methods, and computer program products for protecting circuits are provided. Aspects include receiving, by a processing element, a feedback signal, the feedback signal taken from an output of a circuit, determining a range of expected feedback values, comparing the feedback signal to the range of expected feedback values, and based at least in part on determining that the feedback signal is outside the range of expected feedback values for a first length of time, disabling the circuit.

19 Claims, 3 Drawing Sheets

PROTECTING ANALOG OUTPUT CIRCUITS FROM SHORT CIRCUITS

BACKGROUND

The present invention generally relates to analog circuits, and more specifically, to protecting analog output circuits from short circuits.

A short circuit is an electrical circuit that allows a current to travel along an unintended path with no or very low electrical impedance. This results in an excessive current flowing through the circuit. Short circuits can cause significant damage and potentially hazardous conditions when present in electronic circuits. Sensitive components such as transistors can overheat and be damaged with the excessive current caused by a short circuit. Typical approaches to addressing short circuit issues include additional circuitry added to the circuit that limits the amount of current that can flow until additional circuits can shut off the output and prevent all current from flowing. These additional circuit approaches, however, are typically expensive, large, and, at times, unreliable.

SUMMARY

Embodiments of the present invention are directed to system. A non-limiting example of the system includes a processor coupled to a memory, the processor configured to perform receiving, by a processing element, a feedback signal, the feedback signal taken from an output of a circuit, determining a range of expected feedback values, comparing the feedback signal to the range of expected feedback values, and based at least in part on determining that the feedback signal is outside the range of expected feedback values for a first length of time, disabling the circuit.

Embodiments of the present invention are directed to a method for protecting circuits. A non-limiting example of the method includes receiving, by a processing element, a feedback signal, the feedback signal taken from an output of a circuit, determining a range of expected feedback values, comparing the feedback signal to the range of expected feedback values, and based at least in part on determining that the feedback signal is outside the range of expected feedback values for a first length of time, disabling the circuit.

Embodiments of the present invention are directed to a computer program product for protecting circuits. A non-limiting example of the computer program product includes a non-transitory computer readable storage medium having program instructions embodied therewith, the program instructions executable by a processor to cause the processor to receiving, by a processing element, a feedback signal, the feedback signal taken from an output of a circuit, determining a range of expected feedback values, comparing the feedback signal to the range of expected feedback values, and based at least in part on determining that the feedback signal is outside the range of expected feedback values for a first length of time, disabling the circuit.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
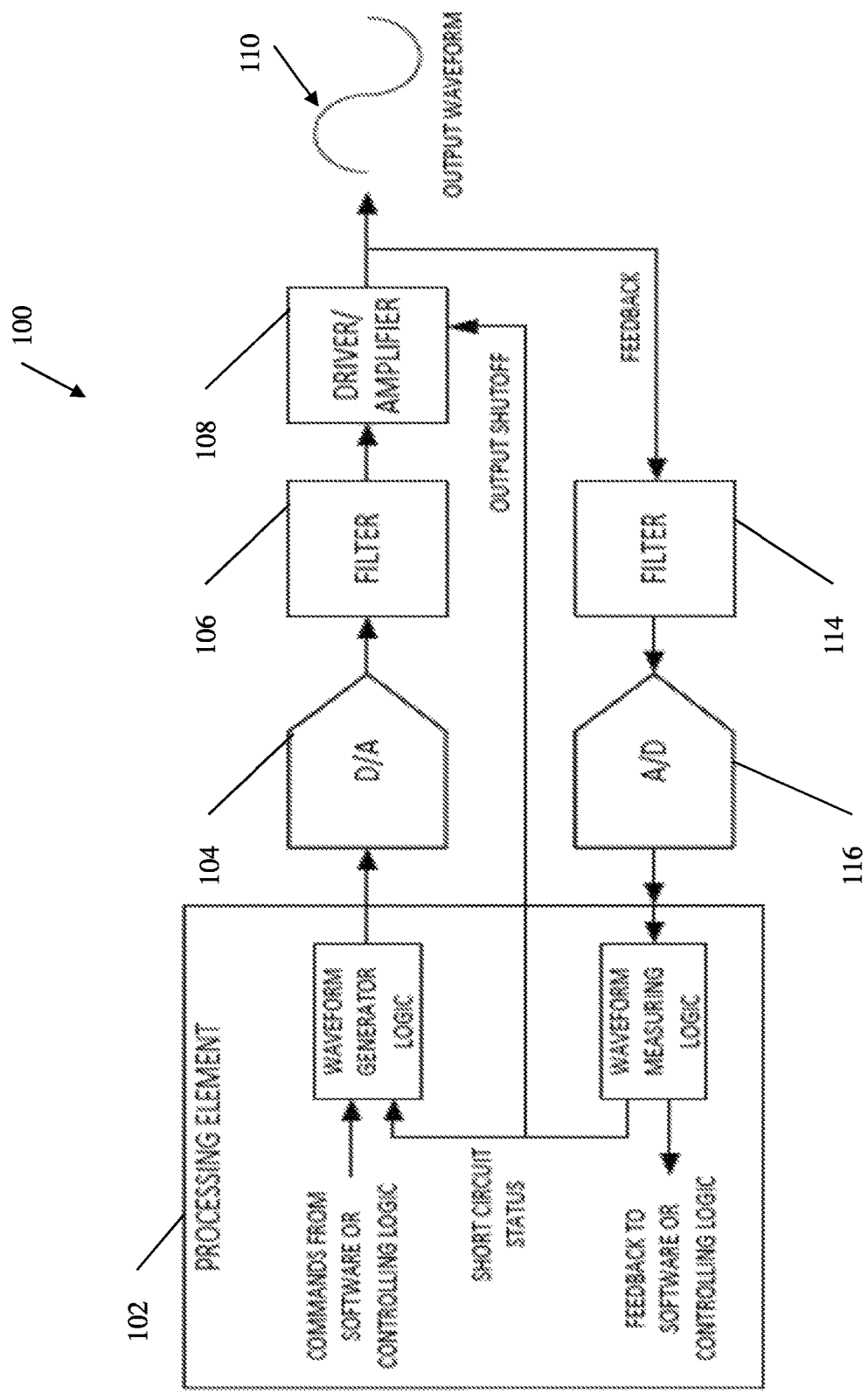
FIG. 1 depicts a block diagram of a system for protecting analog output circuits according to one or more embodiments.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

Turning now to an overview of technologies that are more specifically relevant to aspects of the invention, short circuits within analog output circuits can cause circuit damage and other potentially hazardous conditions for the output circuit and the connected load. Short circuits cause large currents to flow to or from an output of the analog circuit which causes a large amount of power to be dissipated in output transistors and other related components. The large power consumption can easily cause circuit failure and potentially other hazardous conditions. Normally, this condition can be mitigated by adding additional circuitry that limits the amount of current that can flow within an output circuit until additional circuits shut off the output and prevent all current from flowing. However, this circuitry is large, expensive, and sometimes unreliable.

One or more of the above-described aspects of the disclosure may address the shortcomings of the prior art by providing a circuit design with fewer components, smaller and less expensive lower-power components, and components that require less heat-sinking hardware. The disclosed circuit designs can detect and protect against shorts to ground and shorts to a direct current (DC) or an alternating current (AC) voltage source. In one or more embodiments, the circuit designs do not add any additional circuitry and can utilized existing circuit components to perform this function. That is to say, aspects, described herein, take advantage of the typical circuitry that exists in the basic analog output circuit to protect the circuit from short circuits. This achieved through monitoring data from an analog-to-digital (A/D) converter in a feedback path and comparing the data values read from this feedback path to an expected waveform. For example, is the output of the circuit were shorted (i.e., zero voltage), then the feedback readings of the A/D would report a continuous stream of zero volt readings rather than the intended waveform. This information taken from the feedback path can be utilized to shut off the output circuit, thus protecting the circuit and any attached loads from damage associated with a short circuit.

FIG. 1 depicts a block diagram of a system for protecting analog output circuits according to one or more embodiments. The system 100 includes a processing element 102 and associated logic. In one or more embodiments, the processing element 102 and any of the functions performed by the processing element 102 (i.e., by the associated logic) can be implemented by executable instructions and/or circuitry such as a processing circuit and memory. The processing circuit can be embodied in any type of central processing unit (CPU), including a microprocessor, a digital signal processor (DSP), a microcontroller, an application specific integrated circuit (ASIC), a field programmable gate array (FPGA), or the like. Also, in embodiments, the memory may include random access memory (RAM), read only memory (ROM), or other electronic, optical, magnetic, or any other computer readable medium onto which is stored data and algorithms as executable instructions in a non-transitory form.

The processing element 102 can control a digital-to-analog converter (D/A) 104 which can be any type of D/A integrated circuit or other device that converts a digital signal from the processing element 102 to an analog waveform. For example, the D/A 104 can be a circuit using voltage references, an analog switch, or a resistor-capacitor filter. The output of the D/A 104 is connected to an analog filter 106 which smooths out the waveform and turns the waveform into a desired output waveform. The output of the filter 106 is connected to a driver/amplifier 108 circuit that is operable to output a desired output waveform 110 for an impedance need of a load. The output of the Driver/Amplifier 108 is also connected to another filter 114 that is part of a feedback circuit. This filter 114 removes noise such as elector-magnetic interference (EMI) from the signal before it is sampled by an A/D 116 converter. The A/D 116 is monitored by the processing element 102 at a sampling rate that can be predetermined based on the load or application for the system 100. The processing element 102 converts the A/D 116 sampled readings into a format needed for a controlling software or controlling logic. For example, the processing element 102 can convert digital numbers from the A/D 116 into volts DC or volts RMS. These values can be utilized in a conventional closed-loop feedback system or for built-in test (BIT).

Figure 2:
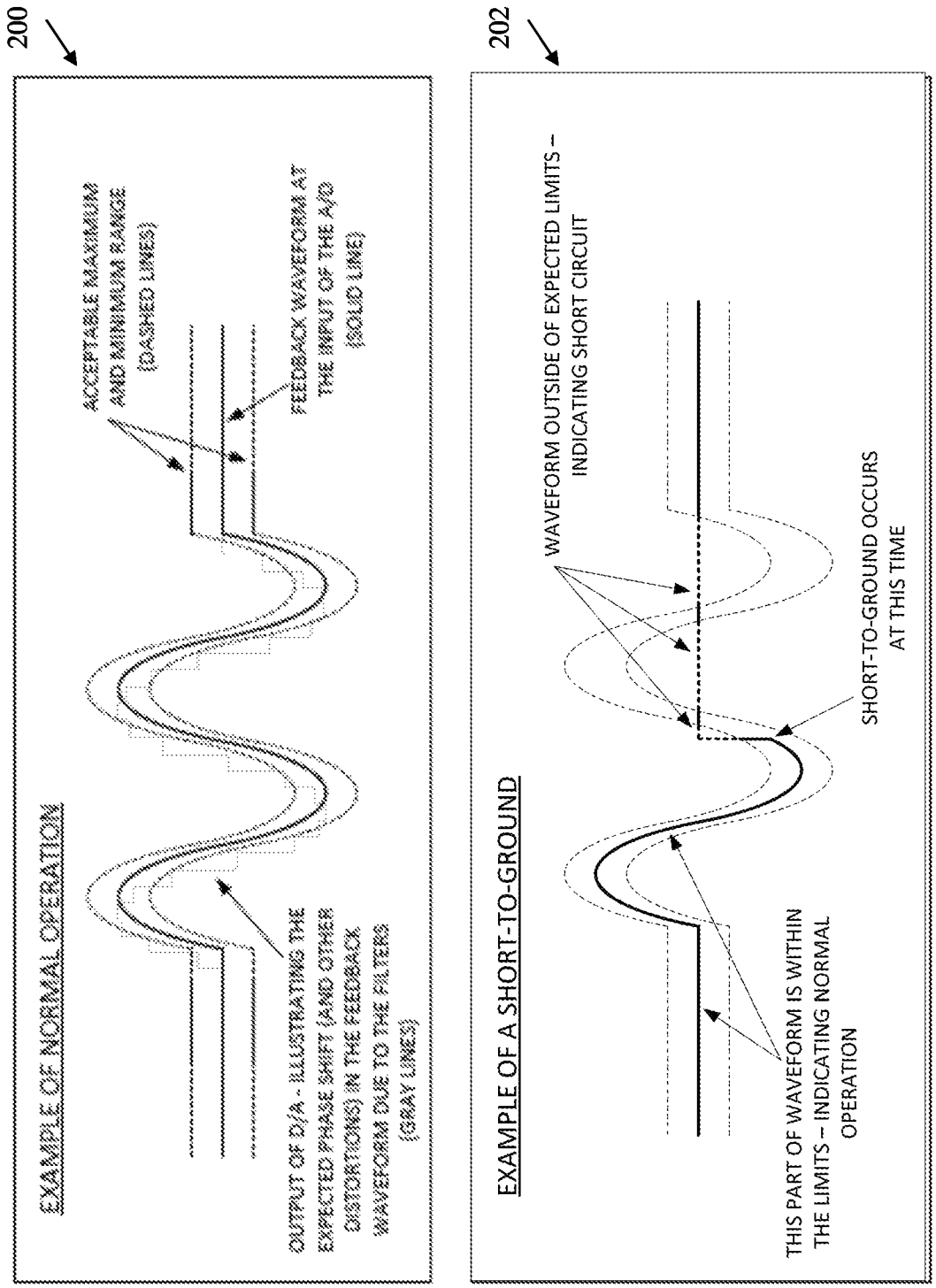
FIG. 2 depicts two exemplary waveforms showing normal operation and a short event according to one or more embodiments.

In one or more embodiments, the processing element 102 uses feedback data to detect and protect against potential short circuits. This is performed by comparing the waveform read from the feedback circuit to an expected waveform including a range tolerance that can be determined from the design of the circuitry. That is to say, the designer of the circuit can analyze the circuit to determine what the tolerance needs to be. The expected range of feedback voltages can include the distorting effects caused by the filters 106, 114 and other circuit components. For example, the processing element 102 and associated logic can account for phase shift when the waveform is sinusoidal, or a "rounding off" effect during a sudden change (e.g., a "step change") in the waveform. Also, the processing element 102 and associated logic can account for the digitizing effect of the A/D 104, 116. FIG. 2 depicts two exemplary waveforms showing normal operation and a short event operation according to one or more embodiments. The normal operations waveform 200 includes a depiction of a maximum and minimum limit on the feedback waveform. As shown in the exemplary normal operation waveform, a minimum and maximum waveform range is defined. The range anticipates an expected phase shift (and other distortions) in the feedback waveform due to the filters. The acceptable maximum and minimum ranges are shown as the dashed lines in the waveform depiction 200.

In one or more embodiments, should the output of the circuit be shorted to ground, for example, then the feedback waveform will be measured as a continuous stream of zero volt readings plus or minus small tolerances. This can result in the feedback waveform exceeding the expected limits during all or some of the waveform as depicted in the exemplary short event waveform 202. The illustrated example shows a short-to-ground waveform caused by a short-to-ground event. However, if the short circuit is to a voltage source other than ground, then the feedback waveform will also exceed the expected limits for a similar reason. It is also possible to be commanding an output voltage and to have a short circuit to a voltage source that happens to be within the expected limits. To address this issue, the driver/amplifier 108 is designed to withstand this type of minimal failure mode. However, as soon as the commanded voltage is changed to a value so that the short circuited voltage is outside the expected limits, the failure is detected.

In one or more embodiments, when a short circuit is detected by the processing element 102 and associated logic, the processing element will "debounce" the failure. That is to say, the processing element 102 can verify that there is a failure by waiting a period of time to determine that the failure indication continues. The debounce time can be determined by the electrical and thermal characteristics of the circuit design and any electrical glitches the circuit is exposed to. Should a brief glitch caused by electric noise cause a short circuit detection (i.e., a false detection), then the failure indication will be transient. If the failure indication remains for the debounce time, then a short circuit can be confirmed. The driver/amplifier 108 can be designed to withstand the short circuit for the debounce time, which can range in the microsecond to millisecond time range. Once the short circuit is confirmed, then the processing element 102 can command the output to turn off. This is performed by commanding the D/A 104 to output zero volts while also commanding the driver/amplifier 108 to turn off which causes the circuit to act as an open circuit. This provides protection to any output transistors and other components.

In one or more embodiments, the short event waveform 202 depiction illustrates how the processing element 102 and associated logic can account for an issue where the failure indication can cycle on and off depending on the waveform being output and the waveform of the shorted voltage source. As shown in the short-to-ground waveform 202 depiction, the output waveform is a sinusoid and the short circuit can be to a DC voltage such as ground (i.e., zero volts). In this case the expected limits will cycle above and below the feedback voltage as shown in the depiction 202. In one or more embodiments, to address this issue, the debounce time can be defined as shorter than the minimum time that the feedback voltage is outside of the expected limits or the processing element 102 and associated logic can expect the failure indication to cycle on and off during the debounce time. In the latter case, the driver/amplifier 108 can be designed to withstand the short circuit until the processing element 102 shuts of the driver/amplifier 108.

In one or more embodiments, when the driver/amplifier 108 is shut off, the processing element 102 can optionally wait an appropriate period of time ("cool down time") to allow any output transistors and other circuit components to cool down from the brief time that these components were withstanding any high current from the short circuit. After this cool down time, the processing element 102 can turn the circuit on again. If the short-circuit persists, then the processing element 102 can detect the failure indication again and shut off the output. This can continue until the short circuit conditions are removed or addressed. At this time, the output will turn on and operate normally without having to be manually reset.

Figure 3:
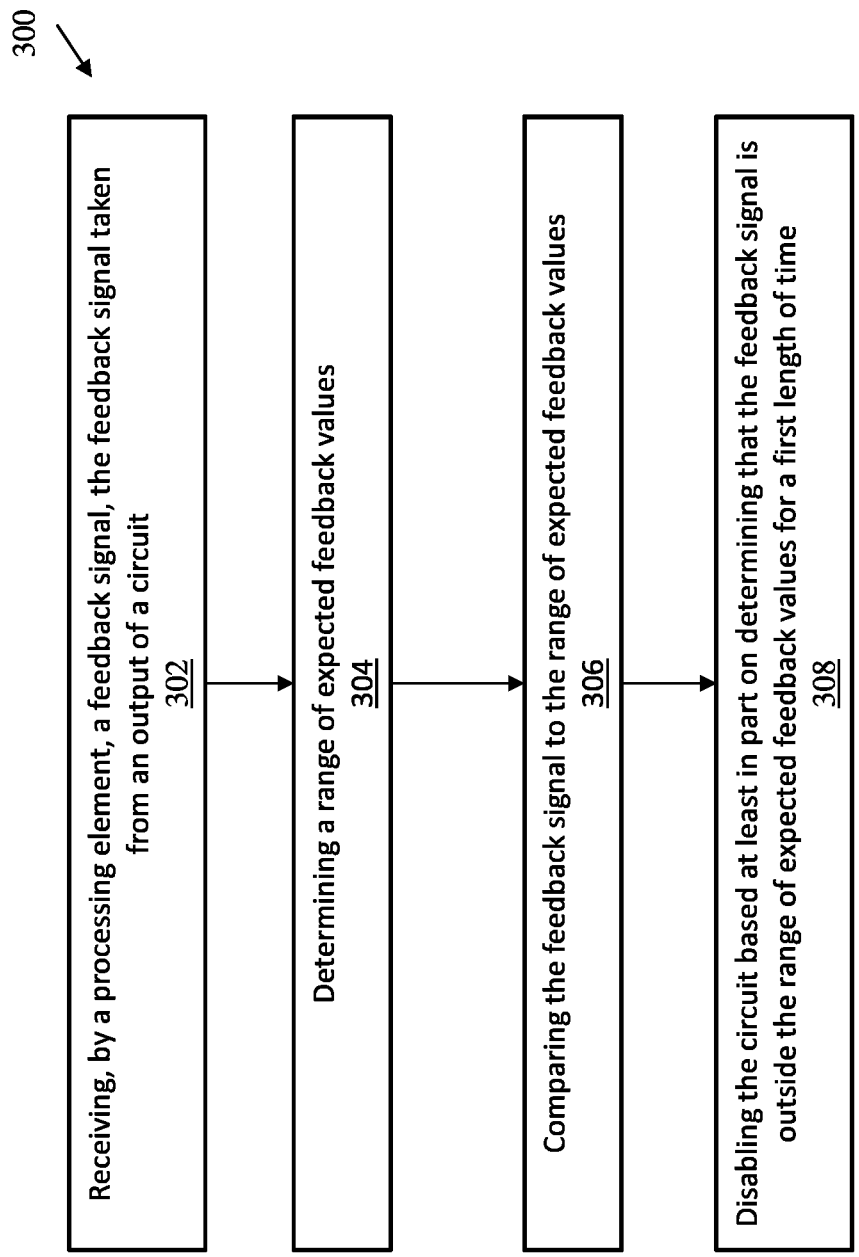
FIG. 3 depicts a flow diagram of a method for protecting circuits according to one or more embodiments.

FIG. 3 depicts a block diagram of a method for protecting circuits according to one or more embodiments. The method 300 includes receiving, by a processing element, a feedback signal, the feedback signal taken from an output of a circuit, as shown in block 302. At block 304, the method 300 includes determining a range of expected feedback values. This range of feedback values or tolerances is determined based on the circuitry and the load connected to the circuitry. In addition, the range of feedback voltages includes distorting effected caused by any filters and other circuit components. The method 300, at block 306, includes comparing the feedback signal to the range of expected feedback values. And, at block 308, the method 300 includes based at least in part on determining that the feedback signal is outside the range of expected feedback values for a first length of time, disabling the circuit.

Additional processes may also be included. It should be understood that the processes depicted in FIG. 3 represent illustrations, and that other processes may be added or existing processes may be removed, modified, or rearranged without departing from the scope and spirit of the present disclosure.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method for protecting circuits, the method comprising:
   receiving, by a processing element, a feedback signal, the feedback signal taken from an output of a circuit;
   comparing the feedback signal to a range of expected feedback values;
   determining that the feedback signal is outside the range of expected feedback values for a first length of time, wherein the first length of time is determined based on electrical and thermal characteristics of the circuit; and
   disabling the circuit for a cooldown length of time;
   enabling the circuit after the cooldown length of time elapses.

2. The method of claim 1, wherein the circuit comprises:
   a digital-to-analog converter, an analog-to-digital converter, a first filter, a second filter, and a driver/amplifier.

3. The method of claim 2, wherein disabling the circuit comprises shutting off an output of the driver/amplifier.

4. The method of claim 2, wherein disabling the circuit comprises shutting off an output of the digital-to-analog converter.

5. The method of claim 2, wherein the feedback signal is read from an output of the analog-to-digital converter.

6. The method of claim 1, wherein the feedback signal is sampled by the processing element periodically.

7. The method of claim 1, wherein the processing element comprises at least one of a microprocessor, a microcontroller, and a field programmable gate array (FPGA).

8. A system for protecting circuits, the system comprising:
   a processor communicatively coupled to a memory, the processor configured to:
      receive a feedback signal, the feedback signal taken from an output of a circuit;

compare the feedback signal to a range of expected feedback values; and based at least in part on determining that the feedback signal is outside the range of expected feedback values for a first length of time, wherein the first length of time is determined based on electrical and thermal characteristics of the circuit, disable the circuit for a cooldown length of time;

enabling the circuit after the cooldown length of time elapses.

9. The system of claim 8, wherein the processor is further configured to enable the circuit after a second length of time elapses after disabling the circuit.

10. The system of claim 8, wherein the circuit comprises:
a digital-to-analog converter, an analog-to-digital converter, a first filter, a second filter, and a driver/amplifier.

11. The system of claim 10, wherein disabling the circuit comprises shutting off an output of the driver/amplifier.

12. The system of claim 10, wherein disabling the circuit comprises shutting off an output of the digital-to-analog converter.

13. The system of claim 10, wherein the feedback signal is read from an output of the analog-to-digital converter.

14. A computer program product for protecting circuits, the computer program product comprising a non-transitory computer readable storage medium having program instructions embodied therewith, the program instructions executable by a processor to cause the processor to:

receive a feedback signal, the feedback signal taken from an output of a circuit;

compare the feedback signal to a range of expected feedback values; and based at least in part on determining that the feedback signal is outside the range of expected feedback values for a first length of time, wherein the first length of time is determined based on electrical and thermal characteristics of the circuit, disable the circuit for a cooldown length of time;

enabling the circuit after the cooldown length of time elapses.

15. The computer program product of claim 14, further comprising enabling the circuit after a second length of time elapses after disabling the circuit.

16. The computer program product of claim 14, wherein the circuit comprises:
a digital-to-analog converter, an analog-to-digital converter, a first filter, a second filter, and a driver/amplifier.

17. The computer program product of claim 16, wherein disabling the circuit comprises shutting off an output of the driver/amplifier.

18. The computer program product of claim 16, wherein disabling the circuit comprises shutting off an output of the digital-to-analog converter.

19. The computer program product of claim 16, wherein the feedback signal is read from an output of the analog-to-digital converter.

* * * * *